United States Patent
Choi et al.

(10) Patent No.: US 11,667,524 B2
(45) Date of Patent: Jun. 6, 2023

(54) METHOD FOR FABRICATING SEMICONDUCTOR DEVICE

(71) Applicant: HYUNDAI KEFICO CORPORATION, Gyeonggi-do (KR)

(72) Inventors: Jun Hwan Choi, Seoul (KR); Chi Yeon Kim, Gyeonggi-do (KR)

(73) Assignee: Hyundai Kefico Corporation, Gyeonggi-Do (KR)

( * ) Notice: Subject to any disclaimer, the term of this patent is extended or adjusted under 35 U.S.C. 154(b) by 106 days.

(21) Appl. No.: 17/130,335

(22) Filed: Dec. 22, 2020

(65) Prior Publication Data

US 2021/0188628 A1 Jun. 24, 2021

(30) Foreign Application Priority Data

Dec. 23, 2019 (KR) .................. 10-2019-0173183

(51) Int. Cl.
*B81C 1/00* (2006.01)
*G01L 19/06* (2006.01)

(52) U.S. Cl.
CPC .. *B81C 1/00357* (2013.01); *B81C 2201/0133* (2013.01); *B81C 2201/0176* (2013.01); *B81C 2201/0178* (2013.01); *B81C 2201/0195* (2013.01); *G01L 19/0654* (2013.01)

(58) Field of Classification Search
CPC .................. B81C 1/00357; B81C 1/00023
See application file for complete search history.

(56) References Cited

U.S. PATENT DOCUMENTS

| | | | |
|---|---|---|---|
| 5,695,557 A | 12/1997 | Yamagata et al. | |
| 2006/0101912 A1 | 5/2006 | Wu et al. | |
| 2011/0204750 A1* | 8/2011 | Fujii | H01L 41/316 29/25.35 |
| 2014/0183601 A1* | 7/2014 | Lallement | H01L 29/267 257/200 |
| 2015/0340241 A1* | 11/2015 | Fujioto | H01L 21/30608 257/798 |
| 2016/0071761 A1* | 3/2016 | Tobisaka | H01L 21/304 438/459 |
| 2017/0011964 A1* | 1/2017 | Liang | H01L 21/02002 |
| 2017/0210617 A1* | 7/2017 | Sadaka | B81C 1/00047 |
| 2018/0072569 A1* | 3/2018 | Berggren | H01L 41/094 |
| 2018/0148327 A1* | 5/2018 | Chang | B81C 1/00269 |

FOREIGN PATENT DOCUMENTS

| | | |
|---|---|---|
| KR | 100145786 B1 | 11/1998 |
| KR | 100781474 B1 | 12/2007 |
| KR | 20130041620 A | 4/2013 |
| KR | 101923671 B1 | 11/2018 |

* cited by examiner

*Primary Examiner* — Moazzam Hossain
(74) *Attorney, Agent, or Firm* — Fox Rothschild LLP

(57) ABSTRACT

Disclose is a method for fabricating a semiconductor device. The method includes: forming a groove such as by etching one side surface of a first substrate; attaching a second substrate including a silicon layer on the etched surface of the first substrate formed with the hollow groove; etching the second substrate so as to leave substantially only the silicon layer; forming a thin film structure on the surface of silicon layers of the second substrate; and separating the second substrate formed with the thin film structure from the first substrate. For example, the groove structure may be formed in the lower portion of the device in the process of fabricating the semiconductor device to facilitate the final device separation.

11 Claims, 6 Drawing Sheets

METHOD FOR FABRICATING SEMICONDUCTOR DEVICE

CROSS-REFERENCE TO RELATED APPLICATIONS

This application claims the benefit of Korean Patent Application No. 10-2019-0173183 filed on Dec. 23, 2019, the entire contents of which is incorporated herein by reference for all purposes as if fully set forth herein.

TECHNICAL FIELD

The present invention relates to a method for fabricating a semiconductor device. Particularly, the method may include forming a hollow groove structure in the lower portion of a semiconductor device, which may facilitate a final device separation.

BACKGROUND

Electronic products such as a smartphone, a notebook, and an embedded device are miniaturized, whereas one component is increasingly required to be miniaturized as the number of components included in one electronic product is increased.

In the electronic product, a sensor that measures external signals such as a location and acceleration is important to provide base data allowing a central processing unit and to provide the user with necessary information.

In particular, a pressure sensor is an element which receives the size of a force applied to the sensor as a physical quantity and converts the size of the force into an electrical signal to output the electrical signal. The pressure sensor may be classified into a pressure resistance type sensor, which forms a silicon pressure resistor between a thin film formed by a semiconductor process according to the pressure sensing method and a substrate to utilize the change in the resistance of the pressure resistor when the thin film is deformed by a pressure, and a capacitive type sensor, which utilizes the change in capacitance between electrodes when a gap between electrode plates is changed by an external stress.

In the related art, the MEMS pressure sensor forms a device by depositing a structural layer and a sacrificial layer on a non-conductor substrate such as a silicon substrate, a group III-V compound substrate, such as a gallium arsenide compound, or a sapphire substrate, and then separating the structural layer from the substrate by an etching process removing the sacrificial layer.

However, the MEMS pressure sensor based on the sacrificial layer has problems. For example, since the structural layer is formed above the sacrificial layer, it is difficult for an etching material to penetrate into the lower portion of the device and the structural layer may be damaged, thereby eventually decreasing a yield.

SUMMARY

In preferred aspects, provided is a method of improving the above problems of the conventional waterproof structure for the gas sensor and providing a waterproof structure for a gas sensor which facilitates the assembling and improves the waterproof and ventilation performance.

In an aspect, provided is a method for fabricating a semiconductor device.

In one aspect, the present methods for fabricating a semiconductor device may comprise: (a) forming a groove on a first substrate; (b) attaching a second substrate comprising a silicon active layer to a surface of the first substrate formed with the groove; (c) etching the second substrate so as to leave substantially only the silicon active layer; (d) forming a thin film structure on the silicon active layer of the second substrate. Additionally, preferably, the second substrate formed with the thin film structure may be separated from the first substrate.

In a further preferred aspect, the present methods may include: forming a groove by etching one side surface of a first substrate, attaching a second substrate on the first substrate formed with the groove, etching the second substrate so as to leave substantially only the silicon active layer, forming a thin film structure on the surfaces of silicon active layers of the second substrate, and separating the second substrate formed with the thin film structure from the first substrate. The thin film may include one or more insulating film layers.

In preferred aspects, when the second substrate is etched so as to leave substantially only the silicon active layer, the etched remaining substrate will be at least 70, 80, 85, 90, 95, 98 99 or even 100 percent by weight composed of the silicon active layer.

The first substrate may include a group III-V compound including gallium arsenide compound or gallium nitride, silicon, silicon carbide, silicon oxide ($SiOx$), or aluminum oxide ($AlOx$) substrate.

The second substrate may be a silicon substrate, or a silicon on insulator (SOI) substrate formed with an oxide layer having the insulating property and a monocrystalline silicon layer on the silicon substrate.

The forming of the groove of the first substrate may include using alkaline hydroxide and an alkaline aqueous solution including hydroxyl amine and thiourea. The formed groove suitably may be hollow.

The alkaline hydroxide may include one or more selected from potassium hydroxide, sodium hydroxide, ethylenediamine pyrocatechol (EDP), and tetramethylammonium hydroxide.

The first substrate and the second substrate may be attached by a melting bonding or hybrid bonding method.

The etching the second substrate may be performed by using alkaline hydroxide including potassium hydroxide, sodium hydroxide, ethylenediamine pyrocatechol (EDP), and tetramethylammonium hydroxide, and an alkaline aqueous solution including hydroxyl amine and thiourea, and then the second substrate may be etched by using an aqueous solution including a hydrogen fluoride compound or a gas including a hydrogen fluoride compound.

The forming of the thin film structure on the etched surface of the second substrate may include laminating a silicon oxide ($SiOx$) layer and a silicon nitride ($SiNx$) layer on the surface of the silicon layer of the second substrate.

Preferably, the silicon oxide ($SiOx$) layer may be formed by oxidating a part of the silicon layer using a thermal oxidation process and a silicon nitride ($SiNx$) layer may be formed by a chemical reaction on the surface of the silicon layer using a low temperature chemical vapor deposition (LPCVD).

In the forming of the thin film structure on the etched surface of the second substrate, a p-type dopant including boron may be doped in the thin film structure and then thermally treated.

In the forming of the thin film structure on the etched surface of the second substrate, the thin film structure may be etched by using the reaction gas including one or more of argon and fluorine-based compounds.

In the forming of the thin film structure on the etched surface of the second substrate, one of aluminum, copper, and tungsten may be deposited.

In the separating of the second substrate from the first substrate, the second substrate may be separated from the first substrate using vacuum adsorption or tweezer.

According to various exemplary embodiments of the present invention, the method for fabricating the semiconductor device may form the groove structure on one side surface of the first substrate prior to the step of forming the thin film structure of the semiconductor device, and then easily separate the second substrate formed with the thin film structure from the first substrate, thereby obtaining the high yield.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
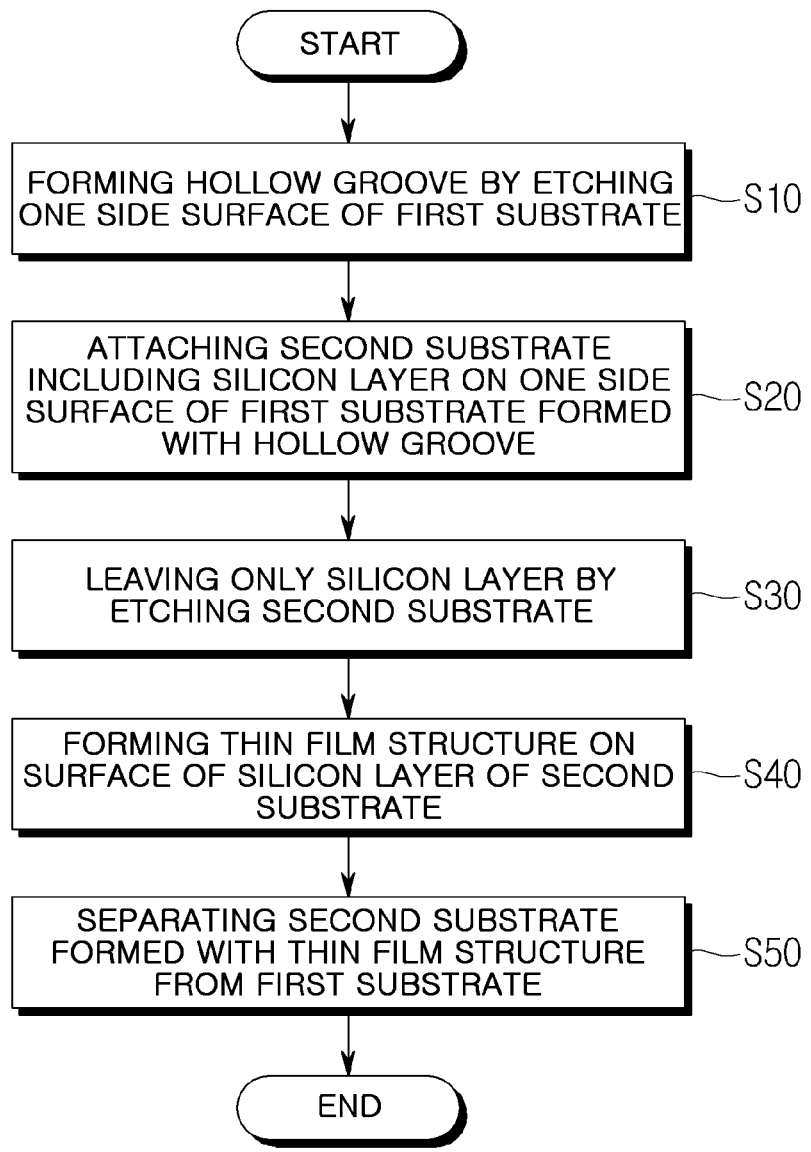
FIG. 1 shows an exemplary method for fabricating an exemplary semiconductor device according to an exemplary embodiment of the present invention.

Hereinafter, a preferred exemplary embodiment of the present invention will be described in detail with reference to the accompanying drawings.

Various changes and various exemplary embodiments may be made in the present invention, such that specific exemplary embodiments are illustrated in the drawings and described in detail in the specification. It should be understood, however, that the exemplary embodiments are not intended to limit the present invention to the particular disclosed forms, but the present invention includes all modifications, equivalents, and alternatives falling within the sprit and technical scope of the present invention.

In describing the present invention, the terms "first," "second," and the like may be used to illustrate various components, but the components should not be limited by the terms. The terms are used only to differentiate one element from another. For example, a first component may be referred to as a second component, and similarly, the second component may also be referred to as the first component without departing from the scope of the present invention without departing from the scope of the present invention.

The terms "and/or" include a combination of a plurality of related listed items or any of a plurality of related listed items.

When a component is referred to as being "connected" or "coupled" to another component, it may be directly connected or coupled to another component, but it may be understood that other components may be present therebetween. On the other hand, when a component is referred to as being "directly connected" or "directly coupled" to another component, it may be understood that there are no other components therebetween.

The terminology used herein is merely for the purpose of describing particular embodiments, and is not intended to limit the present invention. The singular forms may include plural forms unless the contexts clearly indicate the opposite.

In the present application, it may be understood that the term "comprising", "having", or the like specifies the presence of the characteristic, integer, step, operation, component, part, or a combination thereof described in the specification, and does not exclude the presence or addition possibility of one or more other characteristics, integers, steps, operations, components, parts or combinations thereof in advance.

Unless otherwise indicated, all numbers, values, and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values.

Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

In the present specification, when a range is described for a variable, it will be understood that the variable includes all values including the end points described within the stated range. For example, the range of "5 to 10" will be understood to include any subranges, such as 6 to 10, 7 to 10, 6 to 9, 7 to 9, and the like, as well as individual values of 5, 6, 7, 8, 9 and 10, and will also be understood to include any value between valid integers within the stated range, such as 5.5, 6.5, 7.5, 5.5 to 8.5, 6.5 to 9, and the like. Also, for example, the range of "10% to 30%" will be understood to include subranges, such as 10% to 15%, 12% to 18%, 20% to 30%, etc., as well as all integers including values of 10%, 11%, 12%, 13% and the like up to 30%, and will also be understood to include any value between valid integers within the stated range, such as 10.5%, 15.5%, 25.5%, and the like.

Unless defined otherwise, all terms including technical terms and scientific terms used herein have the same meaning as commonly understood by those skilled in the art to which the present invention pertains. The terms defined in the dictionary commonly used may be interpreted as having a meaning consistent with the meaning in the context of the related technology, and may not be interpreted as an ideal or excessively formal meaning, unless clearly defined in the present application.

Further, the following exemplary embodiment is provided to explain the present invention more completely to those skilled in the art, and the shape, size, and the like of the elements in the figures may be exaggerated for a clearer explanation.

In an aspect, provided is a method for fabricating a semiconductor device. As shown in FIG. 1, an exemplary method may include steps of: forming a roove by etching one side surface of a first substrate (S10), attaching a second substrate including a silicon layer to the etched side surface of the first substrate formed with the groove (S20), etching the second substrate so as to leave only the silicon layer (S30), forming a thin film structure including one or more insulating film layers on the surface of the silicon layer of the second substrate (S40), and separating the second substrate formed with the thin film structure from the first substrate (S50).

FIG. 1 shows an exemplary method for fabricating insulating film semiconductor device in five steps, but the present invention is not limited thereto, and may be performed by being divided or repeated according to the specific process, and all of them fall within the scope of the present invention. For convenience, FIGS. 2 to 10 below will be described with five steps.

Figure 2:
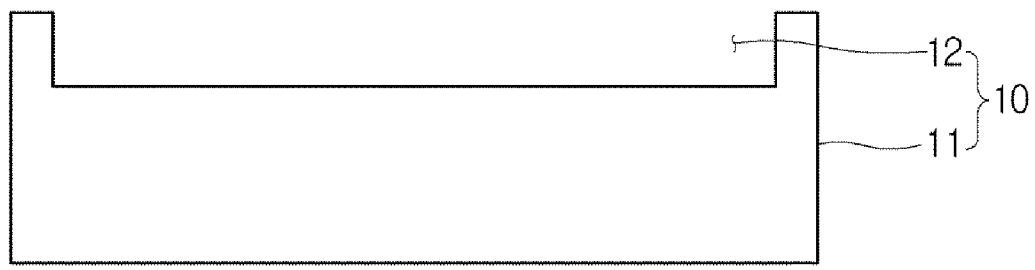
FIG. 2 shows a cross section of a first substrate formed with a groove, in the method for fabricating the semiconductor device according to an exemplary embodiment of the present invention.

As shown in FIG. 2, the forming of the groove by etching the one side surface of the first substrate (S10) may use, as a substrate, one of a group III-V compound including gallium arsenide compound or gallium nitride, silicon, silicon carbide, silicon oxide (SiOx), or aluminum oxide (AlOx). For example, a p-type monocrystalline silicon substrate including boron, aluminum, gallium, and indium elements or a n-type monocrystalline silicon substrate including phosphorus, antimony, and bismuth elements generally used in the semiconductor process, may be used. In another example, a quartz or sapphire substrate generally used in an LED or display TFT process may be used.

In the step of the forming of the groove for example by etching the one side surface of the first substrate (S10), the groove having the desired height and width may be formed by applying or immersing the first substrate in an alkaline aqueous solution including alkaline hydroxide, which may be selected from potassium hydroxide, sodium hydroxide, ethylenediamine pyrocatechol (EDP), or tetramethylammonium hydroxide, hydroxyl amine, and thiourea to hold the first substrate for a predetermined time and then washing the first substrate. For example, the groove having the height of about 1 micrometer to 50 micrometers may be formed by utilizing a potassium hydroxide standard solution including about 0.1 M potassium hydroxide in the process.

Figure 3:
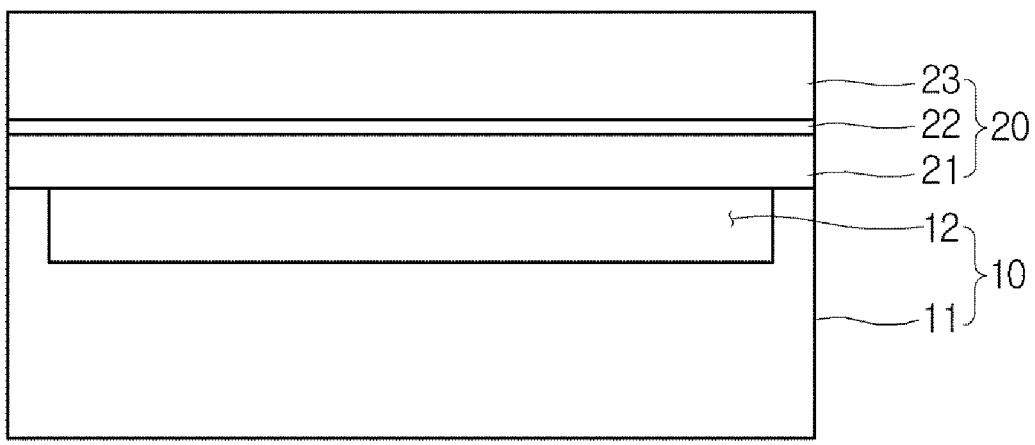
FIG. 3 shows a cross section of a second substrate coupled to the first substrate, in the method for fabricating the semiconductor device according to an exemplary embodiment of the present invention.

As shown in FIG. 3, the attaching of the second substrate including the silicon layer on the etched side surface of the first substrate formed with the groove (S20) may use an SOI substrate including a silicon active layer 21, a first insulating film 22, and a second support layer 23 as a second substrate 20. In particular, this step may include blocking the influence of the second support layer 23 by the first insulating film 22 in the fabricating process of the silicon active layer 21. For example, the SOI substrate may be a structure in which a silicon oxide film is formed above the silicon support layer, and the monocrystalline silicon active layer is formed above the silicon oxide film.

The attaching of the second substrate including the silicon layer on the etched side surface of the first substrate formed with the groove (S20) may form the first substrate 10 and the second substrate 20 by a fusion bonding which is the bonding by the chemical coupling through a heating process without an additional intermediate layer. For example, hydroxyl group (—OH) formed on the surfaces of the first substrate 10 including silicon and the second substrate 20 including silicon forms ether bonds (—O—) through the heating to be attached, such that the process may be simple and the additional material may be unnecessary, thereby increasing economic feasibility.

Figure 4:
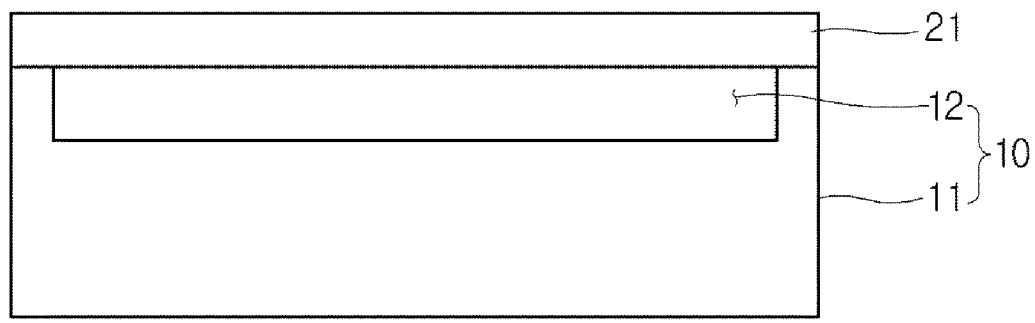
FIG. 4 shows cross sections of the second substrate on which only a silicon layer remains after etched and the first substrate, in the method for fabricating the semiconductor device according to an exemplary embodiment of the present invention.

As shown in FIG. 4, the second support layer 23 may be removed by applying or immersing the first substrate in an alkaline aqueous solution including alkaline hydroxide selected from potassium hydroxide, sodium hydroxide, ethylenediamine pyrocatechol (EDP), and tetramethylammonium hydroxide, hydroxyl amine, and thiourea to hold the first substrate for a predetermined time and then washing the first substrate. For example, the entire silicon support layer may be removed by utilizing the potassium hydroxide standard solution including about 0.1 M potassium hydroxide in the process.

The step of etching the second substrate (S30) for leaving only the silicon layer by etching the second substrate, after etching the second support layer (23), may remove or etch the first insulating film (22) using an aqueous solution including a hydrogen fluoride compound or a gas including a hydrogen fluoride compound. For example, the first insulating film 22, which is silicon oxide, may be removed by using a solution including about 49% hydrogen fluoride and ammonium fluoride in water.

Figure 5:
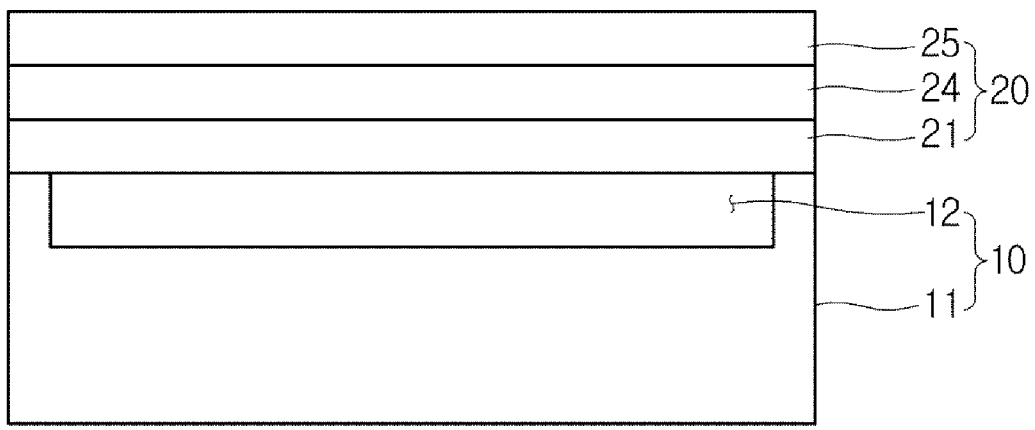
FIG. 5 shows cross sections of the second substrate formed with a thin film structure and the first substrate, in the method for fabricating the semiconductor device according to an exemplary embodiment of the present invention.

As shown in FIG. 5, in the step of forming of the thin film structure on the surface of the silicon layer of the second substrate (S40), the second insulating film 24 may be formed by oxidating a part of the silicon active layer 21 using a thermal oxidation process. For example, the silicon oxide may be formed by the chemical reaction by injecting oxygen or water to heat the silicon active layer 21 at a temperature of about 800° C. to 1000° C. When water is to be injected, the oxide film may be formed thicker than the case where only the oxygen is injected in the same temperature condition.

In the step of forming of the thin film structure on the surface of the silicon layer of the second substrate (S40), a second insulating film 24 and a nitride film 25 may be formed on the surface of the silicon active layer 21 using a low temperature chemical vapor deposition (LPCVD), and an insulating film and a nitride film may be repeatedly, additionally laminated. For example, the insulating film including silicon oxide may be formed by thermally decomposing tetra-ethyl-ortho-silicate (TEOS). In another example, the nitride film composed of the silicon nitride may be formed by reacting an ammonia gas with a silane gas.

Figure 6:
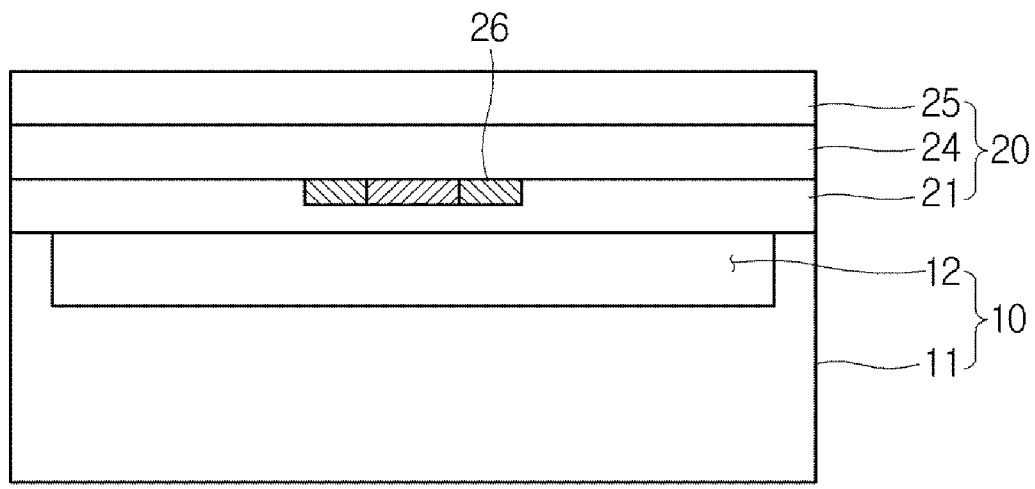
FIG. 6 shows cross sections of the second substrate, in which a p-type dopant including boron is doped in the thin film structure and then thermally treated, and the first substrate, in the method for fabricating the semiconductor device according to an exemplary embodiment of the present invention.

As shown in FIG. 6, in the step of forming of the thin film structure on the surface of the silicon layer of the second substrate (S40), the p-type dopant including boron may be doped in the thin film structure and then thermally treated. For example, one of a photoresist film, oxide, nitride, polycrystalline silicon, and a metal thin film, which are mask materials, may be deposited on the surface of the thin film structure, and a boron trifluoride gas may be ionized in a high vacuum environment and then accelerated at about 5000 keV to be injected into the thin film layer and thermally treated. In another example, the resistance may be partially adjusted through multiple doping by varying the concentration of boron operating as the p-type dopant. The process may be performed by being divided or repeated according to the specific process, and all of them fall within the scope of the present invention.

Figure 7:
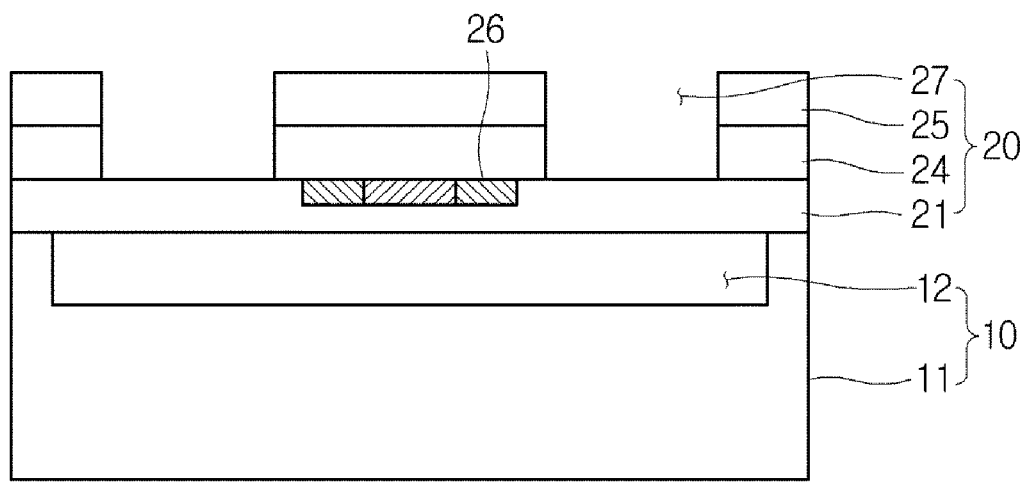
FIG. 7 show cross sections of the second substrate, in which a part of the thin film structure is etched, and the first substrate, in the method for fabricating the semiconductor device according to an exemplary embodiment of the present invention.

As shown in FIG. 7, in the step of forming of the thin film structure on the surface of the silicon layer of the second substrate (S40), the thin film structure may be etched by using the reaction gas including at least one of argon or fluorine-based compounds. For example, the silicon oxide may be etched by ionizing the reaction gas including carbon tetrafluoride using the voltage of about 250 to 500 V in the condition where the atmosphere pressure may be about 0.01 to 0.1 Torr. In another example, the reaction speed may be adjusted according the concentration of oxygen using the reaction gas including carbon tetrafluoride and oxygen.

Figure 8:
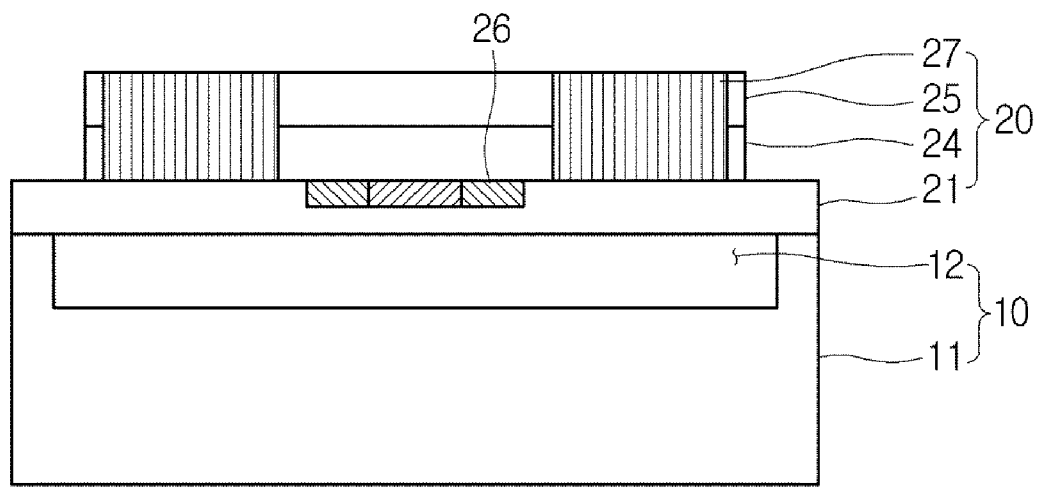
FIG. 8 shows cross sections of the second substrate, in which a metal is deposited on the thin film structure, and the first substrate, in the method for fabricating the semiconductor device according to an exemplary embodiment of the present invention.

As shown in FIG. 8, in the step of forming of the thin film structure on the surface of the silicon layer of the second substrate (S40), one selected from aluminum, copper, and tungsten may be deposited. For example, one of aluminum, copper, and tungsten may be deposited by a sputtering process, which utilizes an argon gas, using a metal target including one of aluminum, copper, and tungsten. In another example, one of the aluminum, copper, and tungsten may be deposited by being evaporated by an arc discharge utilizing the metal target including one of aluminum, copper, and tungsten.

Figure 9:
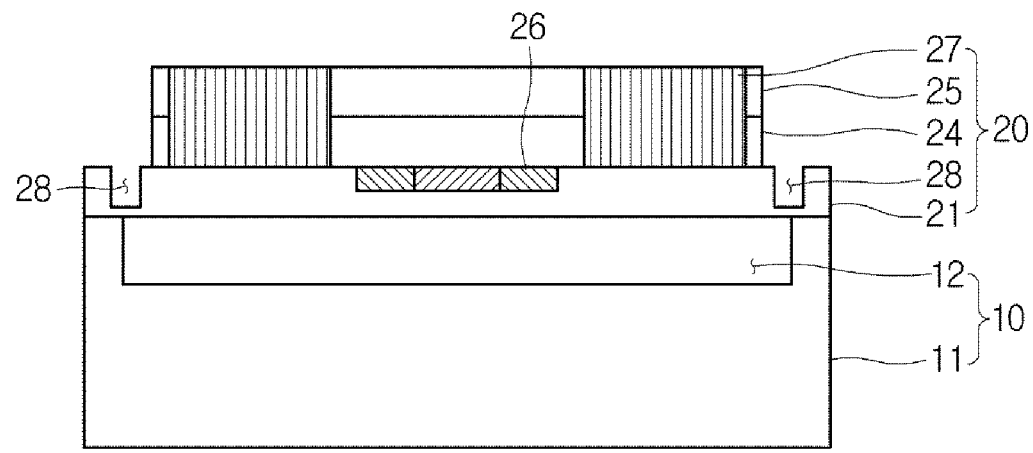
FIG. 9 shows cross sections of the second substrate, in which the side surface of the thin film structure is partially etched, and the first substrate, in the method for fabricating the semiconductor device according to an exemplary embodiment of the present invention.

As shown in FIG. 9, in the step of forming of the thin film structure on the surface of the silicon layer of the second substrate (S40), a part of the silicon active layer may be etched by using the reaction gas including at least one of argon or fluorine-based compounds. For example, the silicon active layer on which the thin film structure may not be formed may be etched by ionizing the reaction gas including carbon tetrafluoride using the voltage of about 250 to 500V in the condition where the atmosphere pressure may be about 0.01 to 0.1 Torr. The second substrate may be easily separated in the separating of the second substrate formed with the thin film structure from the first substrate (S50) by etching a part of the silicon active layer.

Figure 10:
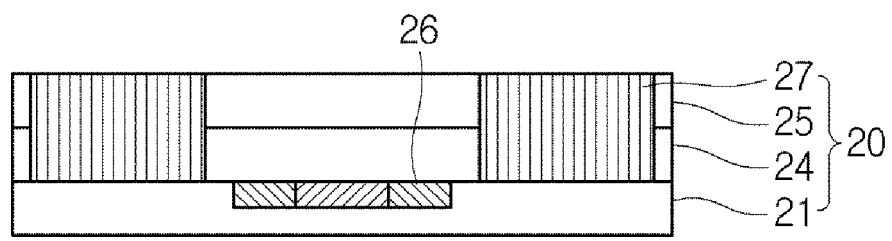
FIG. 10 shows cross sections of the second substrate, which is separated from the first substrate in the method for fabricating the semiconductor device according to an exemplary embodiment of the present invention.

As shown in FIG. 10, in the step of separating of the second substrate formed with the thin film structure from the first substrate (S50), the second substrate may be separated from the first substrate using vacuum adsorption or tweezer. For example, the second substrate may be separated by applying an external force to the upper portion of the first substrate, after adsorbing the first substrate using a vacuum chuck which is a device adsorbing and fixing a product.

As described above, it will be understood by those skilled in the art to which the present invention pertains that the aforementioned technical configuration of the present invention may be carried out in other specific forms without changing the technical spirit or essential features of the present invention.

Therefore, it should be understood that various exemplary embodiments are illustrative in all respects and not restrictive, the scope of the present invention is defined by the claims to be described later rather than the aforementioned detailed description, and it should be interpreted that all changed or modified forms derived from the meaning and scope of the claims and the equivalent concept thereof are included in the scope of the present invention.

What is claimed is:

1. A method for fabricating a semiconductor device, comprising:
    forming a groove on one side surface of a first substrate;
    attaching a second substrate comprising a silicon active layer to the surface of the first substrate formed with the groove;
    wherein the first substrate formed with the groove and the second substrate are attached by a fusion bonding formed by the chemical coupling through a heating process;
    etching the second substrate so as to leave substantially only the silicon active layer;
    forming a thin film structure on the silicon active layer of the second substrate;
    wherein a part of the silicon active layer is etched by using a reaction gas comprising at least one selected from argon and fluorine-based compounds; and
    separating the second substrate formed with the thin film structure from the first substrate,
    wherein the second substrate is a silicon on insulator (SOI) substrate comprising the silicon active layer, a first insulating film, and a second support layer, and the first insulating layer is formed above the second support layer and below the silicon active layer,
    wherein the etching of the second substrate comprises:
        etching the second support layer using at least one of an alkaline hydroxide and an alkaline aqueous solution; and
        etching the first insulating film using an aqueous solution comprising a hydrogen fluoride compound or a gas containing a hydrogen fluoride compound.

2. The method of claim 1, wherein the thin film structure comprises one or more insulating film layers.

3. The method of claim 1, wherein the first substrate comprises one or more selected from the group consisting of a group III-V compound, silicon, silicon carbide, silicon oxide ($SiO_x$), or aluminum oxide ($AlO_x$).

4. The method of claim 3, wherein the group III-V compound comprises gallium arsenide compound or gallium nitride.

5. The method of claim 1, wherein the alkaline hydroxide comprises potassium hydroxide, sodium hydroxide, ethylenediamine pyrocatechol (EDP), or tetramethylammonium hydroxide.

6. The method of claim 1, wherein the forming of the thin film structure comprises laminating i) a silicon oxide ($SiO_x$) layer formed by oxidating a part of the silicon active layer using a thermal oxidation process and ii) a silicon nitride ($SiN_x$) layer formed by a chemical reaction on the surface of the silicon layer using a low temperature chemical vapor deposition (LPCVD) on the surface of the silicon layer of the second substrate.

7. The method of claim 6, wherein the silicon oxide (SiOx) layer is formed by oxidating a part of the silicon active layer using a thermal oxidation process and the silicon nitride (SiNx) layer is formed by a chemical reaction on the surface of the silicon layer using a low temperature chemical vapor deposition (LPCVD).

8. The method of claim 6, wherein in the forming of the thin film structure, a p-type dopant comprising boron is doped in the thin film structure and then thermally treated.

9. The method of claim 6, wherein in the forming of the thin film structure, the thin film structure is etched by using a reaction gas comprising one or more of argon and fluorine-based compounds.

10. The method of claim 6, wherein in the forming of the thin film structure, one selected from the group consisting of aluminum, copper, and tungsten is deposited.

11. The method of claim 1, wherein the second substrate is separated from the first substrate using vacuum adsorption or tweezer.

* * * * *